United States Patent [19]

Teague et al.

[11] Patent Number: 5,045,495
[45] Date of Patent: Sep. 3, 1991

[54] FORMING TWIN WELLS IN SEMICONDUCTOR DEVICES

[75] Inventors: Martin J. Teague, Mid. Glamorgan; Andrew D. Strachan; Martin A. Henry, both of Cardiff, all of United Kingdom

[73] Assignee: Inmos Limited, Bristol, England

[21] Appl. No.: 502,532

[22] Filed: Mar. 30, 1990

[30] Foreign Application Priority Data

Apr. 7, 1989 [GB] United Kingdom ............... 8907897

[51] Int. Cl.$^5$ .................. H01L 21/302; H01L 21/76
[52] U.S. Cl. ................... 437/70; 437/147; 437/34; 148/DIG. 70
[58] Field of Search ............. 437/61, 69, 70, 147, 437/149, 34, 63, 979; 148/DIG. 70, DIG. 163

[56] References Cited

U.S. PATENT DOCUMENTS

| 4,027,380 | 6/1977 | Deal et al. | 437/70 |
| 4,516,316 | 5/1985 | Haskell | 437/34 |
| 4,554,726 | 11/1985 | Hillenius et al. | 437/34 |
| 4,925,806 | 5/1990 | Grosse | 437/70 |

OTHER PUBLICATIONS

Wolf et al, Silicon Processing for the VLSI ERA, 1986, pp. 198, 219-220.

Primary Examiner—Brian E. Hearn
Assistant Examiner—Chandra Chaudhari
Attorney, Agent, or Firm—Edward D. Manzo

[57] ABSTRACT

A method of forming a well of one conductivity type in a silicon substrate having a first surface region thereof which is doped with a dopant of one conductivity type and a second surface region thereof which is doped with a dopant of opposite conductivity type. The first and second regions are covered by respective first and second portions of an oxide layer which has been grown on the silicon substrate, the first portion being thicker than the second portion. The substrate is oxidized thereby to increase the thickness of the oxide layer such that the difference in thickness between the first and second portions is reduced. The substrate is also heated to cause diffusion of the dopant of one conductivity type thereby to form a well and of the dopant of opposite conductivity type down into the substrate. The heating step is carried out before, during or after the oxidizing step. The oxide layer is then removed thereby to expose the substrate surface which has a step of around 400 Angstroms in the region of the well boundary.

20 Claims, 1 Drawing Sheet

FORMING TWIN WELLS IN SEMICONDUCTOR DEVICES

BACKGROUND OF THE INVENTION

The present invention relates to a method of forming a well of one conductivity type in a silicon substrate. In particular, the present invention relates to a method for forming twin wells in a CMOS structure.

In conventional CMOS semiconductor devices, at the well boundary there is a step height difference between N-wells and P-wells in the standard twin-well scheme which is generally around 2000 Angstroms. When a photoresist layer is applied over the well boundary between the twin wells, the step height can lead to variations in photoresist thickness in the region up to 10 micrometers wide on either side of the boundary. Due to standing wave effects which occur during photolithographic exposure of the photoresist, each variation of about 600 Angstroms, when mercury G-line exposure tools are employed, in the photoresist thickness can cause variations between the designed dimensions and the actually printed dimensions of up to 0.15 um. Until recently, this loss of dimensional control close to the well boundaries has not been of great significance since such variations accounted for less than 10% of the total designed linewidth (10% being a typical allowable design tolerance). However, linewidths are now being reduced to levels where a 0.15 um variation could account for over 15% of the total feature dimension. Such linewidth variation would effectively exclude critical circuits from within a region 10 microns wide on either side of the well boundary. Hitherto, this restriction on the critical circuit placement has not been a serious design handicap because of the well known bulk CMOS latch-up phenomenon, which itself has precluded placement of active circuitry close to the well boundaries.

However, with the availability of epitaxial silicon substrates and other developments in CMOS latch-up suppression, it has become possible to reduce the spacing between N- and P-channel sources and drains across the well boundary from around 12 microns to less than 4 microns. In order to be able fully to benefit from the advances in CMOS latch-up suppression, there is a real technical need for linewidth variations associated with the well boundaries to be reduced in order to allow the area adjacent to (i.e. within 2 to 10 microns from) the well boundaries to be fully utilized.

In addition, the presence of a step height difference at the well boundary of around 2000 Angstroms in known devices reduces the planarity of the devices. Modern VLSI devices are becoming increasingly reliant on multiple interconnect levels in order to achieve performance, functionality and reliability goals. All such schemes rely heavily on excellent planarization of the dielectric layers between the interconnect levels. Thus there is a continual technical need to increase the overall device planarity.

SUMMARY OF THE INVENTION

The present invention provides a method of forming a well of one conductivity type in a silicon substrate, which method comprises the steps of:

(a) providing a silicon substrate having a first surface region thereof which is doped with a dopant of one conductivity type and a second surface region thereof which is doped with a dopant of opposite conductivity type, the first and second regions being covered by respective first and second portions of an oxide layer which has been grown on the silicon substrate, the first portion being thicker than the second portion;

(b) oxidizing the substrate thereby to increase the thickness of the oxide layer such that the difference in thickness between the first and second portions is reduced;

(c) heating the substrate to cause diffusion the said dopant of one conductivity type thereby to form a well of said one conductivity type in the substrate and also diffusion of the said dopant of opposite conductivity type down into the substrate, the heating step being carried out before, during or after oxidizing step (b); and (d) removing the oxide layer thereby to expose the substrate surface which has a step in the region of the well boundary.

BRIEF DESCRIPTION OF THE DRAWINGS

An embodiment of the present invention will now be described by way of example only with reference to the accompanying drawings in which:

FIG. 5 shows the structure of FIG. 4 after well drive-in; and

DETAILED DESCRIPTION OF THE PREFERRED EMBODIMENTS

Figure 1:
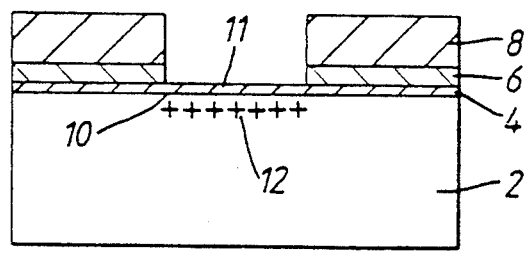
FIG. 1 shows a section through a silicon wafer structure after growth of a layer of oxide, deposition of a layer of silicon nitride, application of a patterned photoresist, etching of exposed silicon nitride and subsequent implantation of a dopant.

Referring to FIG. 1, a silicon wafer substrate 2 is initially oxidized in a known manner in order to grow thereon an oxide layer 4 which is around 500 Angstroms thick. A silicon nitride (Si3N4) layer 6 about 1000 Angstroms thick is then deposited over the oxide layer by chemical vapour deposition. The combined oxide and nitride layers 4, 6 are then patterned with a photoresist layer 8 and the structure is then etched in a conventional manner leaving the photoresist 8 in place and exposing an area 10 of the silicon which is covered by a residual layer 11 of about 350 Angstroms of the initial oxide layer 4 and which is intended to define the well which is subsequently to be formed. Subsequently, a dopant 12 of one conductivity type is implanted into the area 10, the implant 12 ultimately being employed to define the well which is formed. The implant is typically $2.7 \times 10^{12}$ ions/cm$^2$ boron at 125 keV (per ion). The resultant structure is shown in FIG. 1 and the steps employed to form the structure of FIG. 1 are conventional.

In the following description, there is described a twin-well process with a counterdoped P-well and an N-pseudowell on an N-type silicon substrate. Accordingly, the dopant implant 12 is a P-dopant implant since a P-well is designed to be formed. However, the method described can readily be modified, as the man skilled in the art would readily appreciate, to provide a counterdoped N-well and a P-pseudowell on a P-type substrate.

Figure 2:
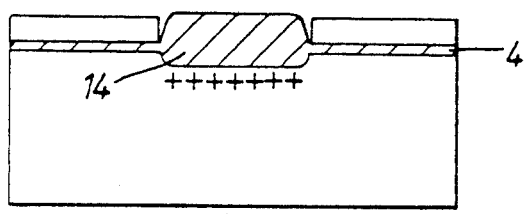
FIG. 2 shows the structure of FIG. 1 after the photoresist has been removed and after further growth of the oxide layer.

Referring now to FIG. 2, the photoresist layer 8 is then removed and a masking oxide 14 about 3000 Angstroms thick is then grown e.g. by a known thermal process in the area 10 above the implant 12. The masking oxide 14 is thinner than masking oxide produced by the conventional process for forming twin wells which has a thickness of around 4000 to 5000 Angstroms and the significance of this thickness difference is discussed hereinbelow.

Figure 3:
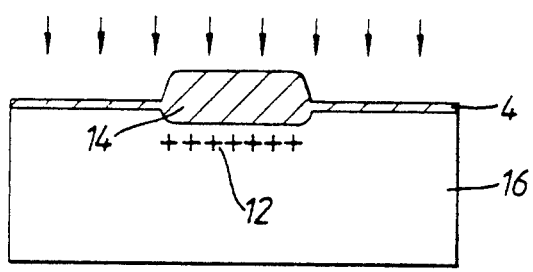
FIG. 3 shows the structure of FIG. 2 after removal of the silicon nitride and during implantation of a dopant.

Referring to FIG. 3, the silicon nitride layer 6 is then removed, e.g. by hot orthophosphoric acid, leaving about 500 Angstroms of initial oxide over those areas to form the N-pseudowell and about 3000 Angstroms of masking oxide over the area 10 to form the P-well. A dopant of opposite conductivity type to the dopant implant 12 is then implanted into the region 16 of the substrate 2 which surrounds the region 10 in the illustrated embodiment, the region 16 being implanted with an N-dopant e.g. phosphorous which is intended to define the N-pseudowell adjacent to the P-well. The N-dopant is implanted through those portions of the original oxide layer 4 which are adjacent the masking oxide 14. The masking oxide 14 prevents N-dopant implantation into the area 10 of the substrate which lies thereunder. The dose of the N-pseudowell implant is the same as that of the conventional process for making twin wells, for example $3.7 \times 10^{12}$ ions/cm$^2$ phosphorous, but the energy of the implant is reduced compared to the known process from about 120 keV to 60 keV (per ion) in order to preclude implant penetration through the thinner masking oxide 14 used in the present invention.

Figure 4:
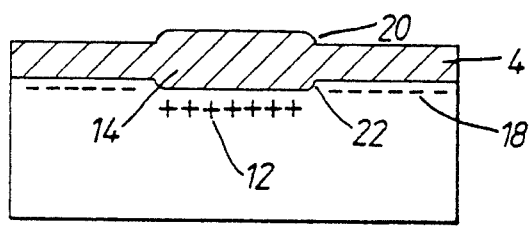
FIG. 4 shows the structure of FIG. 3 after oxidation of the structure.

Referring to FIG. 4, it may be seen that the N-implant 18 which is intended to define the N-pseudowell surrounds the P-implant 12 which is intended to define the P-well.

Figure 5:
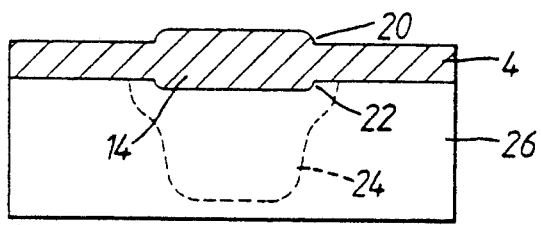

The next steps in the method of the present invention are to activate and drive in the implanted species, this being known as well drive-in, and to oxidize the substrate to reduce the height of the step 20 between the masking oxide 14 and the remaining portions of the original oxide layer 4. The well drive-in step and the oxidation step may be carried out either as a one step process or as a two step process having consecutive steps in any order. In a particularly preferred arrangement, the well drive-in and oxidation steps are carried out in a one step process and this particular process is described below. However, for the sake of clarity of illustration, FIG. 4 shows the substrate after oxidation and FIG. 5 shows the substrate after subsequent well drive-in although it will be appreciated that in the following description oxidation and well drive-in occur simultaneously.

In the preferred method, the oxidation step before the well drive-in during the one step process is carried out by heating the substrate in a steam ambient atmosphere in which hydrogen and oxygen have been introduced (to produce a steam/oxygen atmosphere) for a predetermined period of time during the cycle. The well drive-in is then completed by switching the gases to an inert ambient atmosphere, which is typically nitrogen. This accordingly keeps the temperature cycle the same for both steps; typically the temperature is around 1200° C. Steam is employed to minimize the time of the oxidation step, although a dry oxidation could be used if desired. In the oxidation process, the step height 20 between the masking oxide 14 and the original oxide layer 4 is greatly reduced since the oxide layer 4 grows much quicker in relation to the growth of the masking oxide 14. This growth rate difference is present since the oxidation rate decreases as the thickness of oxide increases. Therefore the oxidation rate in the N-pseudowell region where the oxide layer 4 is around 500 Angstroms thick is initially much higher than in the P-well region where the masking oxide is around 3000 Angstroms thick. This gives an initial reduction in silicon step height although the advantage of diffusion rate limitation decreases as the thickness of oxide in the N-pseudowell region increases. Subsequent oxidation of the silicon after this initial step is still continued at a slightly higher rate in the N-pseudowell region because the N-doping (i.e. by phosphorous) accelerates the oxidation relative to the P-doping (i.e. by boron). In the preferred process, the oxidation by means of steam and oxygen is carried out for around 30 minutes to give a final step height 20 between the upper surfaces of two oxide layers 4, 14 of around 400 Angstroms. Oxidation steps longer than about 60 minutes are not suitable unless changes to well implant doses are employed in order to compensate for dopant segregation. This may also lead to stacking faults being created in the oxide. It would be understood by the skilled man that since the step height 20 on the surface of the oxide layers 4, 14 is reduced to around 400 Angstroms, then the corresponding step height 22 at the silicon/oxide interface (which ultimately consitutes the step height 22 at the well boundary) is similarly reduced to around 400 Angstroms due to the mechanism of the growth of the oxide on the silicon. In the well drive-in step, the implanted dopants 12 and 18 are activated and diffuse into the silicon substrate to define a P-well 24 which is surrounded by an N-pseudowell 26. The resultant structure is shown in FIG. 5.

Figure 6:
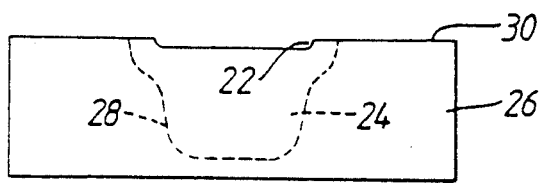
FIG. 6 shows the structure of FIG. 5 after removal of the oxide.

Referring to FIG. 6, the last step in the well formation is to remove all of the oxide constituted by the masking oxide 14 and the remaining portions of the original oxide layer 4 e.g. by means of a 10:1 H$_2$O: HF dip. The final well structure is shown in FIG. 6. It will be seen that there is a step height 22 of around 400 Angstroms at the boundary between the surface of the well region 28 and the adjacent silicon surface 30. Conventional CMOS process steps may subsequently be used in order to form CMOS semiconductor devices.

It will be seen from FIG. 6 that after the oxide has been removed the well boundary step height is around 400 Angstroms and this compares with the height of around 2000 Angstroms for the conventional well-forming process. Thus the present invention has provided a solution to the aforementioned problems of the prior art by minimizing the topography variations at the well boundary. With a 400 Angstrom step at the well boundary, the region where linewidths are affected by the well step has been reduced from 10 microns on either side of the boundary to 2 microns on either side of the boundary. In addition, the linewidth variation within the affected region has been reduced from 0.15 microns to less than 0.05 microns. Such an improvement is more than sufficient to allow critical circuitry to be placed as little as 2 microns from the well edge. This can offer very substantial area savings over the prior art, particularly in some circuit applications such as full CMOS (6 transistor) static random access memory (SRAM) cells.

The present inventors have also discovered that the presence of a 400 Angstrom step is sufficient to secure adequate contrast for darkfield alignment of subsequent layers in photolithographic steps.

The present invention also provides the further processing advantage in that by reducing the well step to around 400 Angstroms compared to the prior art value of around 2000 Angstroms, large scale topography variations associated with conventional twin well CMOS structures are removed and this can considerably simplify the process for obtaining planarization of the structure which will improve both device yield and circuit reliability.

A further advantage of the present invention is that the process is a modification of the standard self-aligned twin-well method which does not require any additional process steps to improve device shrinkability and reliability.

In the known method, as described above a masking oxide 4000 to 5000 Angstroms thick was grown on the substrate. This particular oxide thickness has hitherto been employed in order to ensure no penetration of the P-well by N-dopant (i.e. phosphorous) which has been pushed out of the oxide during the well drive-in. In fact, the present inventors have discovered that a 3000 Angstrom thick masking oxide is easily sufficient to prevent this effect, and by consuming less of the substrate, minimizes the step height to be reduced during the well drive-in.

Furthermore, in the known process, after the implantation of the dopant to form the pseudowell (i.e. by the corresponding implantation step shown in FIG. 3), the conventional practice has been to dip off about 3000 Angstroms of the masking oxide in order to remove the implanted N-dopant (i.e. phosphorous) from the oxide above the P-well, again this being done to guard against N-dopant push out from the oxide during the well drive-in. In the present invention, since an oxidation step is added to the well drive-in step, the phosphorous present in the oxide cannot segregate out into the P-well because the diffusion coefficient of the phosphorous with respect of the oxidizing species is at least several orders of magnitude less at the well drive-in temperature (around 1200° C.), and hence the oxidation front develops much faster than the phosphorous can diffuse to the interface and segregate out. Thus the present invention offers the further advantage that the conventional dipping step before well drive-in can be omitted.

The present invention provides a method of repeatably controlling the step height between N- and P- wells to a minimum value so as still to ensure adequate contrast for darkfield alignment of subsequent layers but so as to reduce the variation in photoresist thickness at the well boundary to enable optimization of the use of the silicon surface.

What we claim is:

1. A method of forming a well of one conductivity type in a silicon substrate, which method comprises the steps of:
    (a) providing a silicon substrate having a first surface region thereof which is doped with a dopant of one conductivity type and a second surface region thereof which is doped with a dopant of opposite conductivity type, the first and second regions being covered by respective first and second portions of an oxide layer which has been grown on the silicon substrate, the first portion being thicker than the second portion;
    (b) oxidizing the substrate thereby to increase the thickness of the oxide layer such that the difference in thickness between the first and second portions is reduced;
    (c) heating the substrate to cause diffusion of the said dopant of one conductivity type thereby to form a well of said one conductivity type in the substrate and also diffusion of the said dopant of opposite conductivity type down into the substrate, the heating step being carried out before, during or after oxidizing step (b); and
    (d) removing the oxide layer thereby to expose the substrate surface which has a step in the region of the well boundary.

2. A method according to claim 1, wherein the oxidising step (b) and the heating step (c) are carried out as a single step in which the oxidation and heating are performed in different ambient atmospheres.

3. A method according to claim 2 wherein the oxidising and heating steps are carried out at substantially the same temperature.

4. A method according to claim 2 wherein the oxidizing step (b) is carried out by heating the substrate in an oxidising atmosphere at a temperature of around 1200° C.

5. A method according to claim 3 wherein the oxidizing step (b) is carried out by heating the substrate in an oxidising atmosphere at a temperature of around 1200° C.

6. A method according to claim 4 wherein the oxidizing step (b) is carried out for about 30 minutes.

7. A method according to claim 5 wherein the oxidizing step (b) is carried out for about 30 minutes.

8. A method according to claim 1 wherein prior to oxidizing step (b) the first and second portions of the oxide layer have a thickness of around 3000 Angstroms and around 500 Angstroms respectively.

9. A method according to claim 1 wherein the height of the step is around 400 Angstroms.

10. A method according to claim 8 wherein the height of the step is around 400 Angstroms.

11. A method according to claim 1 wherein prior to step (a) the oxide layer is of substantially uniform thickness and the first portion of the oxide layer is formed by masking the second portion of the oxide layer with a masking layer and selectively growing oxide on the first surface region of the silicon substrate.

12. A method according to claim 1 wherein the dopant of opposite conductivity type is implanted into the second surface region of the silicon substrate after formation of the first and second portions of the oxide layer, the first portion of the oxide layer acting to mask the first surface region of the silicon substrate from dopant implantation.

13. A method according to claim 12 wherein the dopant of opposite conductivity type is implanted at an energy of 60 keV per ion.

14. A method according to claim 1 wherein the said second surface region of the silicon substrate is comprised in a pseudowell of opposite conductivity type to that of the said well.

15. A method according to claim 1 wherein the well boundary surrounds the first surface region which is lower than the second surface region.

16. A method of forming a well of one conductivity type in a silicon substrate, which method comprises the steps of:
(a) providing a silicon substrate having a first surface region thereof which is doped with a dopant of one conductivity type and a second surface region thereof which is doped with a dopant of opposite conductivity type, the first and second regions being covered by respective first and second portions of an oxide layer which has been grown on the silicon substrate, the first portion being greater than 800 Angstroms thicker than the second portion;
(b) oxidizing the substrate thereby to increase the thickness of the oxide layer such that the difference in thickness between the first and second portions is reduced to around 800 Angstroms;
(c) heating the substrate to cause diffusion of the said dopant of one conductivity type thereby to form a well of said one conductivity type in the substrate and also diffusion of the said dopant of opposite conductivity type down into the substrate, the heating step being carried out before, during or after oxidizing step (b); and
(d) removing the oxide layer thereby to expose the substrate surface which has a step of around 400 Angstroms in the region of the well boundary.

17. A method according to claim 16, wherein before oxidising step (b) the first portion is around 2500 Angstroms thicker than the second portion.

18. A method according to claim 16 wherein the second portion of the oxide layer is around 500 Angstroms thick.

19. A method according to claim 18 wherein prior to step (a) the oxide layer is of substantially uniform thickness and the first portion of the oxide layer is formed by masking the second portion of the oxide layer with a masking layer and selectively growing oxide on the first surface region of the silicon substrate.

20. A method according to claim 19 wherein the dopant of opposite conductivity type is implanted into the second surface region of the silicon substrate after formation of the first and second portions of the oxide layer, the first portion of the oxide layer acting to mask the first surface region of the silicon substrate from dopant implantation.

* * * * *